United States Patent
Sasaki

(10) Patent No.: US 6,637,505 B1
(45) Date of Patent: Oct. 28, 2003

(54) APPARATUS FOR COOLING A BOX WITH HEAT GENERATING ELEMENTS RECEIVED THEREIN AND A METHOD FOR COOLING SAME

(75) Inventor: Chiyoshi Sasaki, Tokyo (JP)

(73) Assignees: The Furukawa Electric Co., Ltd., Tokyo (JP); Sony Computer Entertainment, Inc., Tokyo (JP)

(*) Notice: Subject to any disclaimer, the term of this patent is extended or adjusted under 35 U.S.C. 154(b) by 0 days.

(21) Appl. No.: 09/642,387

(22) Filed: Aug. 18, 2000

(30) Foreign Application Priority Data

Aug. 18, 1999 (JP) .......................................... 11-231438

(51) Int. Cl.⁷ ................................................ F24H 3/06
(52) U.S. Cl. ................. 165/122; 165/104.33; 174/15.2; 361/697; 361/700
(58) Field of Search ................. 165/122, 80.3, 165/80.4, 185, 104.33, 104.34; 361/687, 695, 697, 700; 174/15.2, 15.1

(56) References Cited

U.S. PATENT DOCUMENTS

| | | | | |
|---|---|---|---|---|
| 5,285,347 A | * | 2/1994 | Fox et al. | 165/80.3 |
| 5,297,005 A | * | 3/1994 | Gourdine | 361/697 |
| 5,339,214 A | | 8/1994 | Nelson | |
| 5,402,312 A | * | 3/1995 | Kinjo et al. | 361/695 |
| 5,406,451 A | * | 4/1995 | Korinsky | 165/80.3 |
| 5,646,824 A | * | 7/1997 | Ohashi et al. | 361/699 |
| 5,771,966 A | * | 6/1998 | Jacoby | 165/185 |
| 5,791,406 A | * | 8/1998 | Gonner et al. | 361/704 |
| 5,823,248 A | | 10/1998 | Kadota et al. | |
| 5,964,279 A | * | 10/1999 | Mochizuki et al. | 165/104.33 |
| 6,038,128 A | * | 3/2000 | Hood, III et al. | 361/687 |
| 6,058,009 A | * | 5/2000 | Hood, III et al. | 361/687 |
| 6,084,769 A | * | 7/2000 | Moore et al. | 361/687 |
| 6,094,346 A | * | 7/2000 | Schweers et al. | 361/695 |
| 6,125,035 A | * | 9/2000 | Hood, III et al. | 361/687 |
| 6,172,872 B1 | * | 1/2001 | Katsui | 165/185 |
| 6,181,553 B1 | * | 1/2001 | Cipolla et al. | 361/687 |
| 6,269,863 B1 | * | 8/2001 | Wyler | 165/80.3 |
| 6,288,895 B1 | * | 9/2001 | Bhatia | 361/687 |
| 6,357,514 B1 | * | 3/2002 | Sasaki et al. | 165/80.3 |

FOREIGN PATENT DOCUMENTS

| | | |
|---|---|---|
| EP | 094085 | 9/1999 |
| JP | 10290090 | 10/1998 |
| JP | 11067997 | 3/1999 |
| WO | 9852397 | 11/1998 |

OTHER PUBLICATIONS

A Taiwanese Office Action for counterpart Taiwanese Patent Application No. 089116633 filed Aug. 17, 2000, dated Jun. 7, 2002. *English Translation Provided.*

* cited by examiner

*Primary Examiner*—Henry Bennett
*Assistant Examiner*—Terrell McKinnon

(57) ABSTRACT

A method for cooling a box with heat generating element received therein, comprising the steps of: (1) arranging in the box an air intake port for taking in air from outside and a discharge port for discharging air from the box to the outside, and installing a heat dissipating fin in the box, (2) disposing a part or a whole of the heat dissipating fin close to the air intake port within the box, and (3) causing the air taken in from the air intake port to pass through the heat dissipating fin to dissipate heat generated by the heat generating element, and then discharging air with a temperature raised by passing through the heat dissipating fin from the discharge port to outside of the box, thus cooling the box.

14 Claims, 5 Drawing Sheets

APPARATUS FOR COOLING A BOX WITH HEAT GENERATING ELEMENTS RECEIVED THEREIN AND A METHOD FOR COOLING SAME

BACKGROUND OF THE INVENTION

1. Field of the Invention

The present invention relates to an apparatus for cooling a box with heat generating elements received therein and a method for cooling same in various electronic devices requiring heat dissipation. In particular, the present invention relates to an apparatus for cooling a box with heat generating elements received therein and a method for cooling same in which cool air is taken from outside into the box, heat exchange is implemented therein, and then hot air is discharged.

2. Description of the Related Art

A semiconductor chip or the like which is used in various electronic devices such as a personal computer, a game console or an audiovisual system is downsized and the integration density thereof becomes large to remarkably increase a processing speed, which results in an incredibly high heat generating density.

There is known a method for cooling a box receiving therein such electronic devices as a personal computer, a game console or an audiovisual system including semiconductor chips which have high heat generating density, by means of taking cool air from outside into the box, implementing heat exchange therein, and then discharging the air with an increased temperature from inside the box to outside.

FIG. 7 is a schematic perspective view showing an apparatus for cooling the box according to the conventional cooling method.

As shown in FIG. 7, a printed board 25 is installed within a box 21. There are provided on the box an air intake port 29 for taking in outside air and a discharge port for discharging the air from inside of the box to the outside. Furthermore, a discharge fan 22 for discharging the air is installed on the discharge port. In addition, there is disposed in the vicinity of the discharge port a heat dissipating fin 26 for dissipating the heat generated by heat generating elements (not shown) mounted on the printed board 25 so as to be located close to the discharge fan 22.

The heat generated by the heat generating element mounted on the printed board 25 is discharged within the box 21 by the heat dissipating fin 26. At this time, the outside air is taken in from the air intake port 29 as shown by arrows 23 and passes through the heat dissipating fin by the function of the discharge fan 22, and then is discharged through the discharge port by the discharge fan to the outside of the box as indicated by arrows 24.

FIG. 8 is a schematic longitudinal sectional view of an apparatus for cooling a box according to the conventional method.

A heat pipe is arranged on the apparatus for cooling the box as illustrated in FIG. 8. As shown in FIG. 8, a printed board 25 is installed in the box 21, and the heat generated by the heat generating element 28 is transferred by a heat pipe 27 to the location where a heat dissipating fin 26 is installed. In the box depicted in FIG. 8, there are similarly provided an air intake port 29 for taking in outside air and a discharge port for discharging air from the box to the outside of the box. Furthermore, a discharge fan 22 is arranged close to the discharge port. There is disposed in the vicinity of the discharge port a heat dissipating fin 26 for dissipating the heat generated by the heat generating element 28 mounted on the printed board 25 so as to be located close to the discharge fan 22.

The heat generated from the heat generating element 28 mounted on the printed board 25 is transferred by the heat pipe 27 and is discharged within the box 21 by the heat dissipating fin 26. At this time, the outside air is taken in from the air intake port 29 as shown by arrows 23 and passes through the heat dissipating fin by the function of the discharge fan 22, and then is discharged through the discharge port by the discharge fan to the outside of the box as indicated by arrows 24.

As described above, in the conventional apparatus for cooling the box, when the heat generated by the heat generating element is cooled by the heat sink including the heat dissipating fin, the heat dissipating fin is arranged very close to the discharge fan within the box. More specifically, it is expected that the box is cooled by discharging as large amount of air as possible from within the box to the outside of the box, since the wind velocity is highest just in front of the discharge fan, as far as wind velocity is concerned.

In the conventional apparatus for cooling the box, however, there are the following drawbacks. More specifically, when the heat dissipating fin is arranged very close to the discharge fan within the box, a temperature of the air taken into the box from the air intake port is raised due to the heat generated by the heat generating element within the box. Accordingly, the air with the temperature thus raised passes through the heat dissipating fin not to effectively dissipate the heat, thus deteriorating the cooling efficiency of the heat dissipating fin.

When the heat pipe is applied to the heat sink (heat dissipating fin), a heat source such as the heat generating element has to be arranged so as to be positioned on a level with or below the heat pipe in order to have the heat pipe effectively operated (i.e., assure the operation principle of the heat pipe). In addition, in case of an apparatus which can be both vertically and horizontally installed, a plurality of heat pipes have to be disposed in order to cause the heat pipes to effectively function.

An object of the present invention is therefore to provide an apparatus for cooling a box with heat generating elements received therein and a method for cooling same, by which the cooling efficiency of a heat dissipating fin can be improved and a heat pipe can effectively function.

SUMMARY OF THE INVENTION

To solve the problems in the conventional art, the present inventors have been studying hard. As a result, the following findings are obtained. More specifically, it is found that in the apparatus for cooling a box in which air is taken from outside into the box, heat exchange is implemented therein, and then the air is discharged, when the heat dissipating fin is arranged close to the air intake port instead of the discharge port, the heat dissipating fin can be directly cooled by the air which is taken directly from outside into the box and has a coolest temperature, thereby improving the cooling efficiency of the heat dissipating fin.

Furthermore, it is found that if the heat dissipating fin is installed in such manner to be positioned in the vicinity of or above the heat generating element in the horizontal direction in case that the box is vertically installed, a heat generating source such as the heat generating element can be arranged so as to be a level with or below the heat pipe even if the box is horizontally disposed, which causes all the installed heat pipes to effectively function.

The present invention was made based on the above-mentioned findings.

The first embodiment of a method for cooling a box with heat generating element received therein of the present invention comprises the steps of:
(1) arranging in the box an air intake port for taking in air from outside and a discharge port for discharging air from the box to the outside, and installing a heat dissipating fin in the box;
(2) disposing a part or a whole of said heat dissipating fin close to said air intake port within said box; and
(3) causing said air taken in from said air intake port to pass through said heat dissipating fin to dissipate heat generated by said heat generating element, and then discharging air with a temperature raised by passing through said heat dissipating fin from said discharge port to outside of said box, thus cooling said box.

The second embodiment of a method for cooling a box with heat generating element received therein of the present invention comprises the steps of:
(1) arranging in the box an air intake port for taking in air from outside and a discharge port for discharging air from the box to the outside, and installing a heat dissipating fin and heat transfer means in the box;
(2) disposing a part or a whole of said heat dissipating fin close to said air intake port within said box;
(3) transferring heat generated by said heat generating element to said heat dissipating fin by said heat transfer means; and
(4) causing said air taken in from said air intake port to pass through said heat dissipating fin to dissipate heat generated by said heat generating element, and then discharging air with a temperature raised by passing through said heat dissipating fin from said discharge port to outside of said box, thus cooling said box.

In the third embodiment of a method for cooling a box with heat generating element received therein of the present invention, said heat transfer means comprises at least one heat pipe.

In the fourth embodiment of a method for cooling a box with heat generating element received therein of the present invention, said box can be vertically and/or horizontally installed, and said heat dissipating fin is installed in such manner to be positioned in the vicinity of or above said heat generating element in the horizontal direction when said box is vertically installed.

In the fifth embodiment of a method for cooling a box with heat generating element received therein of the present invention, a fan for discharging air is further installed close to said discharge port.

The first embodiment of an apparatus for cooling a box with heat generating element received therein of the present invention comprises: an air intake port for taking in air from outside of the box; a discharge port for discharging air to outside of the box; and a heat dissipating fin which is partly or entirely disposed close to said air intake port within the box, wherein said air taken in from said air intake port is passed through said heat dissipating fin to dissipate heat generated by said heat generating element, and then air with a temperature raised by passing through said heat dissipating fin is discharged from said discharge port to outside of said box, thus cooling said box.

The second embodiment of an apparatus for cooling a box with heat generating element received therein of the present invention comprises: an air intake port for taking in air from outside of the box; a discharge port for discharging air to outside of the box; a heat dissipating fin which is partly or entirely disposed close to said air intake port within the box; and heat transfer means for transferring heat generated by said heat generating element to said heat dissipating fin, wherein heat generated by said heat generating element is transferred to said heat dissipating fin by said heat transfer means, said air taken in from said air intake port is passed through said heat dissipating fin to dissipate heat generated by said heat generating element, and then air with a temperature raised by passing through said heat dissipating fin is discharged from said discharge port to outside of said box, thus cooling said box.

In the third embodiment of an apparatus for cooling a box with heat generating element received therein of the present invention, said heat transfer means comprises at least one heat pipe.

In the fourth embodiment of a method for cooling a box with heat generating element received therein of the present invention, said box can be vertically and/or horizontally installed, and said heat dissipating fin is installed in such manner to be positioned in the vicinity of or above said heat generating element in the horizontal direction when said box is vertically installed.

In the fifth embodiment of an apparatus for cooling a box with heat generating element received therein of the present invention, said heat dissipating fin comprises a heat sink with said heat dissipating fin fixed between a base member and a fitting member in a sandwiched manner.

In the sixth embodiment of an apparatus for cooling a box with heat generating element received therein of the present invention, a fan for discharging air is further installed close to said discharge port.

DETAILED DESCRIPTION OF THE INVENTION

Figure 1:
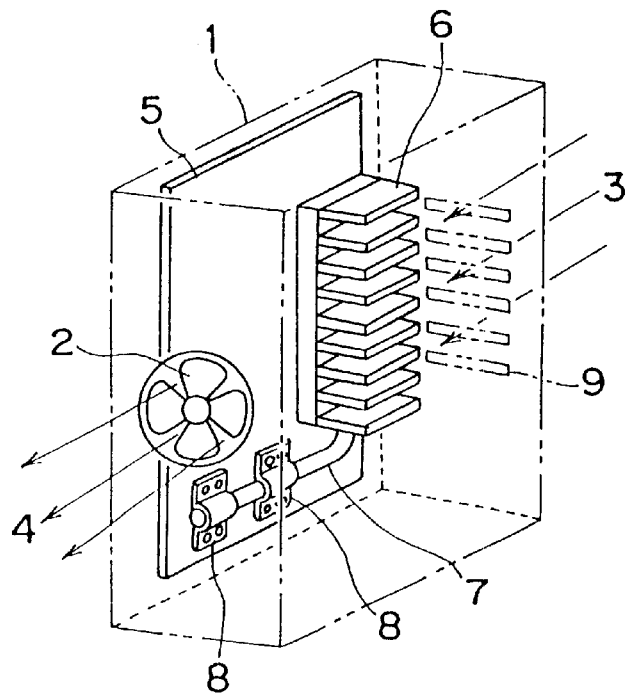
FIG. 1 is a schematic perspective view showing an apparatus for cooling a box with the heat generating element received therein and a method for cooling same according to the present invention.

With reference to the accompanying drawings, there are described an apparatus for cooling a box with a heat generating element received therein and the method for cooling same according to the present invention.

The apparatus for cooling a box with a heat generating element received therein of the present invention comprises an air intake port for taking in air from outside of the box, a discharge port for discharging air to outside of the box, and a heat dissipating fin which is partly or entirely disposed close to the air intake port within the box, wherein the air taken in from the air intake port is passed through the heat dissipating fin to dissipate heat generated by the heat generating element, and then air with a temperature raised by passing through the heat dissipating fin is discharged from the discharge port to outside of the box, thus cooling the box.

In the apparatus of the invention, the heat dissipating fin may comprise a heat sink with the heat dissipating fin fixed between a base member and a fitting member. More specifically, the heat dissipating fin comprises a heat dissipating fin portion which has a plurality of mountain-shaped portions and base portions supporting the mountain-shaped portions, a base member which has a plurality of slits into which the mountain-shaped portions of the heat dissipating fin portion are to be inserted and a plurality of holes for fixing the heat dissipating fin portion, and a fitting member, provided with a plurality of projecting portions corresponding to the plurality of holes of the base member, for fixing the heat dissipating fin portion between the base member and the fitting member itself.

Furthermore, the apparatus for cooling a box with a heat generating element received therein of the present invention comprises an air intake port for taking in air from outside of the box, a discharge port for discharging air to outside of the box; a heat dissipating fin which is partly or entirely disposed close to the air intake port within the box, and heat transfer means for transferring heat generated by the heat generating element to the heat dissipating fin, wherein heat generated by the heat generating element is transferred to the heat dissipating fin by the heat transfer means, the air taken in from the air intake port is passed through the heat dissipating fin to dissipate heat generated by the heat generating element, and then air with a temperature raised by passing through the heat dissipating fin is discharged from the discharge port to outside of the box, thus cooling the box.

The method for cooling a box with heat generating elements received therein of the present invention comprises the following steps. More specifically, it comprises the steps of: (1) arranging in a wall of the box an air intake port for taking in air from outside and a discharge port for discharging air from the box to the outside, and installing a heat dissipating fin in the box with the heat generating element received therein, (2) disposing a part or a whole of the heat dissipating fin close to the air intake port within the box, and (3) passing the air taken in from the air intake port through the heat dissipating fin to dissipate heat generated by the heat generating element, and then discharging air with a temperature raised by passing the heat dissipating fin from the discharge port to outside of the box, thus cooling the box.

The method for cooling a box with a heat generating element received therein and including heat transfer means such as a heat pipe of the present invention comprises the following steps. More specifically, it comprises the steps of (1) arranging in a wall of the box an air intake port for taking in air from outside and a discharge port for discharging air from the box to the outside, and installing a heat dissipating fin and heat transfer means in the box with the heat generating element received therein, (2) disposing a part or a whole of the heat dissipating fin close to the air intake port within the box, (3) transferring heat generated by the heat generating element to the heat dissipating fin by the heat transfer means, and (4) passing the air taken in from the air intake port through the heat dissipating fin to dissipate heat generated by the heat generating element, and then discharging air with a temperature raised by passing the heat dissipating fin from the discharge port to outside of the box, thus cooling the box.

The method for cooling a box of the present invention can be utilized in all the fields of electronic devices requiring heat dissipation.

FIG. 1 is a schematic perspective view showing an apparatus for cooling a box with the heat generating element received therein and a method for cooling same according to the present invention.

As shown in FIG. 1, a printed board 5 is installed within a box 1 vertically disposed. An air intake port 9 for taking in air from outside of the box and a discharge port for discharging air to the outside of the box are disposed in a wall of the box. Furthermore, a fan 2 for discharging air is provided to the discharge port. A heat dissipating fin 6 is provided close to the air intake port 9. One end of a heat pipe 7 for transferring the heat generated by a heat generating element 8 mounted on the printed board 5 to the heat dissipating fin 6 is arranged so as to be in thermally contact with the heat generating element 8, and the other end of the heat pipe is installed in the heat dissipating fin 6 at the printed board side so as to run through the heat dissipating fin along the longitudinal direction thereof.

The heat generated by the heat generating element 8 mounted on the printed board 5 is transferred to the heat dissipating fin 6 by the heat pipe 7. Cool air 3 taken in through the air intake port 9 is directly blown to the heat dissipating fin 6 to cool the heat thus transferred to the heat dissipating fin 6 by the heat pipe. Then, the air within the box 1 whose temperature is raised by dissipating the heat in the heat dissipating fin 6 is discharged through the discharge port to the outside of the box by the discharge fan 2 as shown by arrows 4. According to the present invention, as described above, since the air taken in from the outside of the box whose temperature is coolest is directly blown through the heat dissipating fin, the heat efficiency (i.e., cooling efficiency) of the heat dissipating fin is remarkably high.

Figure 2:
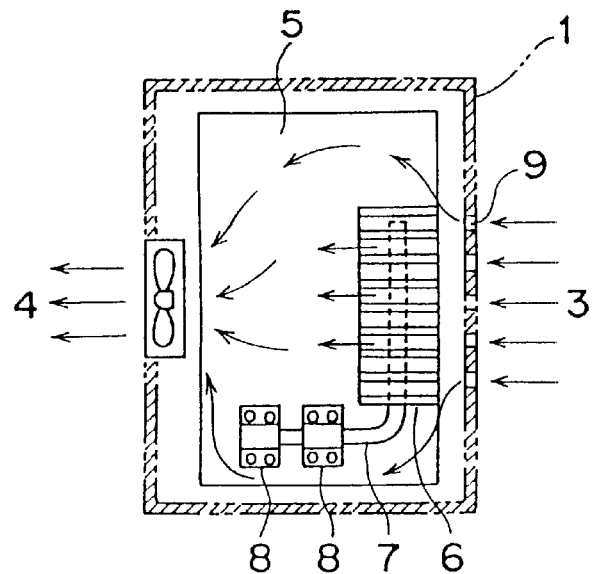
FIG. 2 is a schematic longitudinal cross sectional view of an apparatus for cooling a box with the heat generating element received therein according to the present invention depicted in FIG. 1.

FIG. 2 is a schematic longitudinal cross sectional view of an apparatus for cooling a box with the heat generating element received therein according to the present invention depicted in FIG. 1

As shown in FIG. 2, the printed board 5 is installed within the box 1, and heat generated by the heat generating element 8 mounted on the printed board is transferred by the heat pipe 7 to the position where the heat dissipating fin 6 is installed. The air intake port 9 for taking in air from outside of the box, and the discharge port for discharging air in the box to the outside of the box are also arranged in the wall of the box 1. Furthermore, the fan 2 for discharging air is provided to the discharge port. The heat dissipating fin 6 is provided close to the air intake port 9. One end of the heat pipe 7 for transferring heat generated by the heat generating element 8 mounted on the printed board 5 to the heat dissipating fin 6 is arranged so as to be in thermally contact with the heat generating element 8, and the other end of the heat pipe is installed in the heat dissipating fin 6 at the printed board side so as to run though the heat dissipating fin along the longitudinal direction thereof.

Heat generated by the heat generating element 8 mounted on the printed board 5 is transferred to the heat dissipating fin 6 by the heat pipe 7. Cool air 3 taken in through the air intake port 9 is directly blown to the heat dissipating fin 6 to cool the heat thus transferred to the heat dissipating fin 6 by the heat pipe. Then, the air within the box 1 whose temperature is raised by dissipating the heat in the heat dissipating fin 6 is discharged through the discharge port to the outside of the box by the discharge fan 2 as shown by arrows 4.

Figure 3:
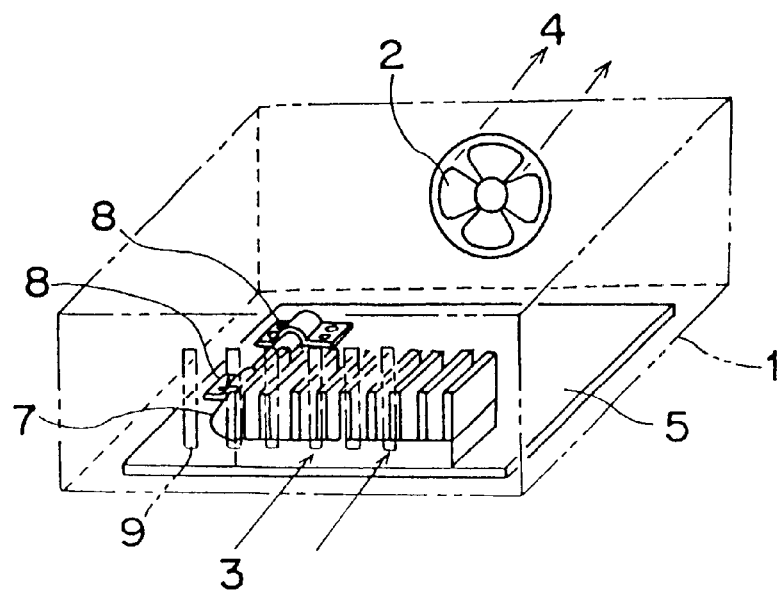
FIG. 3 is a schematic perspective view showing an apparatus for cooling a box with the heat generating element received therein and a method for cooling same according to the present invention.
Figure 4:
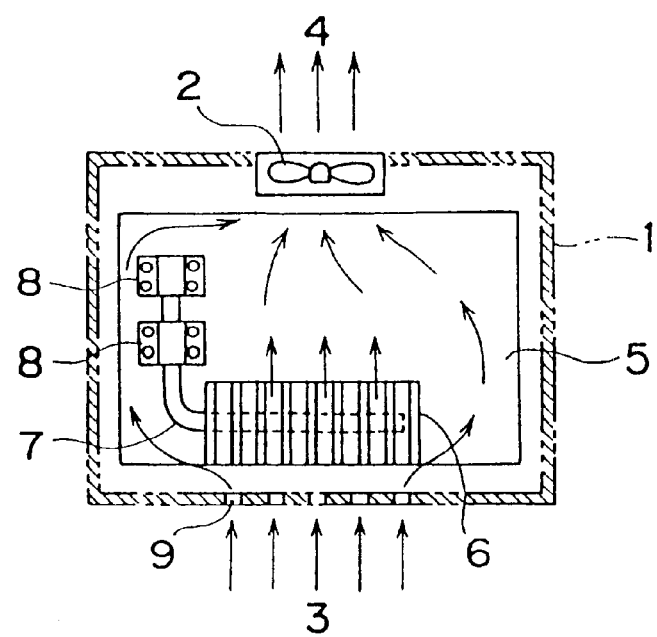
FIG. 4 is a schematic transverse sectional view of an apparatus for cooling a box with the heat generating element received therein according to the present invention.

FIG. 3 is a schematic perspective view showing an apparatus for cooling a box with the heat generating element received therein and a method for cooling same according to the present invention. FIG. 4 is a schematic transverse sectional view of an apparatus for cooling a box with the heat generating element received therein according to the present invention.

As shown in FIGS. 3 and 4, the printed board 5 is installed within the box 1 which is placed horizontally. The air intake port 9 for taking in air from outside of the box, and the discharge port for discharging air in the box to the outside of the box are also arranged in the wall of the box 1. In addition, the fan 2 for discharging air is provided to the discharge port. The heat dissipating fin 6 is provided close to the air intake port 9. One end of the heat pipe 7 for transferring heat generated by the heat generating element 8 mounted on the printed board 5 to the heat dissipating fin 6 is arranged so as to be in thermally contact with the heat generating element 8, and the other end of the heat pipe is installed in the heat dissipating fin 6 at the printed board side so as to run though the heat dissipating fin along the longitudinal direction thereof.

Heat generated by the heat generating element 8 mounted on the printed board 5 is transferred to the heat dissipating fin 6 by the heat pipe 7. Cool air 3 taken in through the air intake port 9 is directly blown to the heat dissipating fin 6 to cool the heat thus transferred to the heat dissipating fin 6 by the heat pipe. Then, the air within the box 1 whose temperature is raised by dissipating the heat in the heat dissipating fin 6 is discharged through the discharge port to the outside of the box by the discharge fan 2 as shown by arrows 4. According to the present invention, as described above, since the air taken in from the outside of the box whose temperature is coolest is directly blown through the heat dissipating fin, the heat efficiency (i.e., cooling efficiency) of the heat dissipating fin is remarkably high.

In the method for cooling a box with a heat generating element received therein, the heat pipe as the heat transfer means comprises at least one heat pipe. A plurality of heat pipes may be used in the present invention.

In the method for cooling a box with a heat generating element received therein, the box may be vertically and/or horizontally installed, as shown in FIGS. 1 and 3, and the heat dissipating fin is installed in the vicinity of or above the heat generating element in the horizontal direction when the box is vertically installed as shown in FIG. 1.

Figure 5:
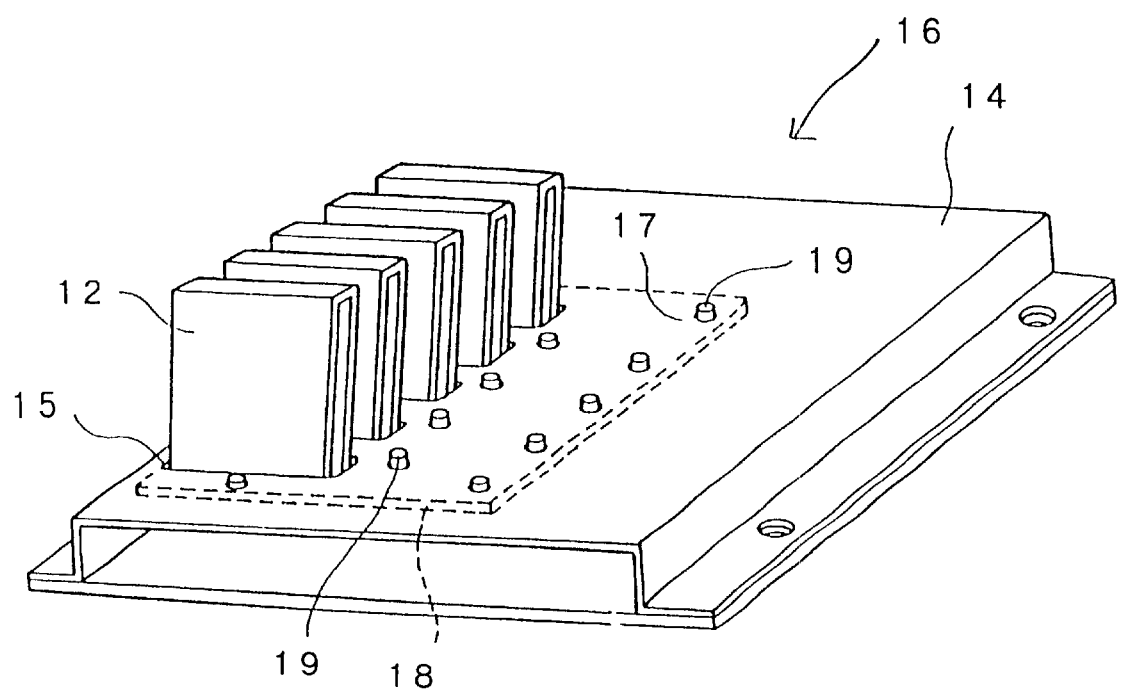
FIG. 5 is a schematic perspective view showing one embodiment of the heat dissipating fin.

FIG. 5 an 6 show one embodiment of the heat dissipating fin of the present invention. More specifically, FIG. 5 is a schematic perspective view showing one embodiment of the heat dissipating fin, and FIG. 6 is a view showing components of the heat dissipating fin.

Figure 6:
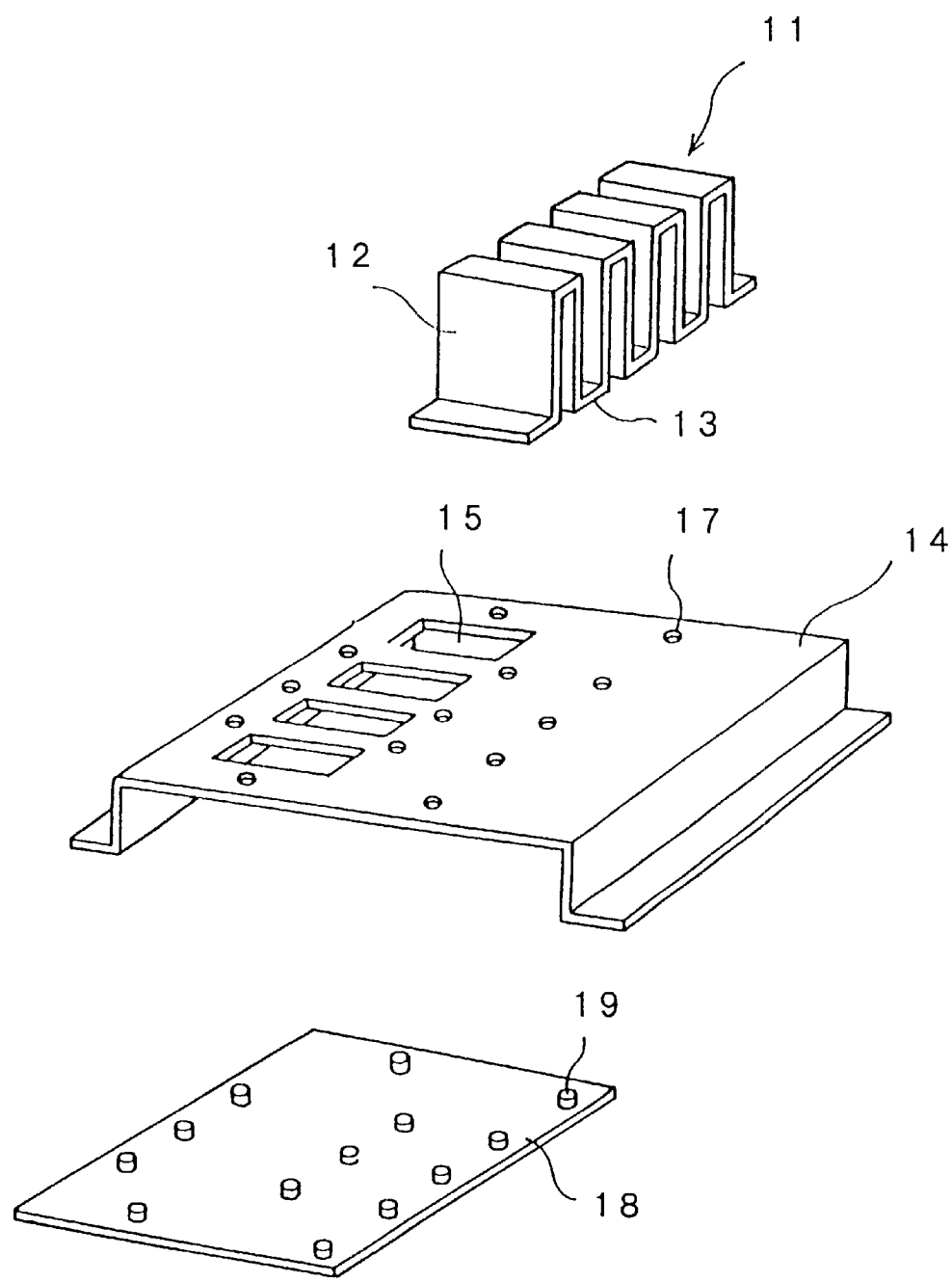
FIG. 6 is a view showing components of the heat dissipating fin.
Figure 7:
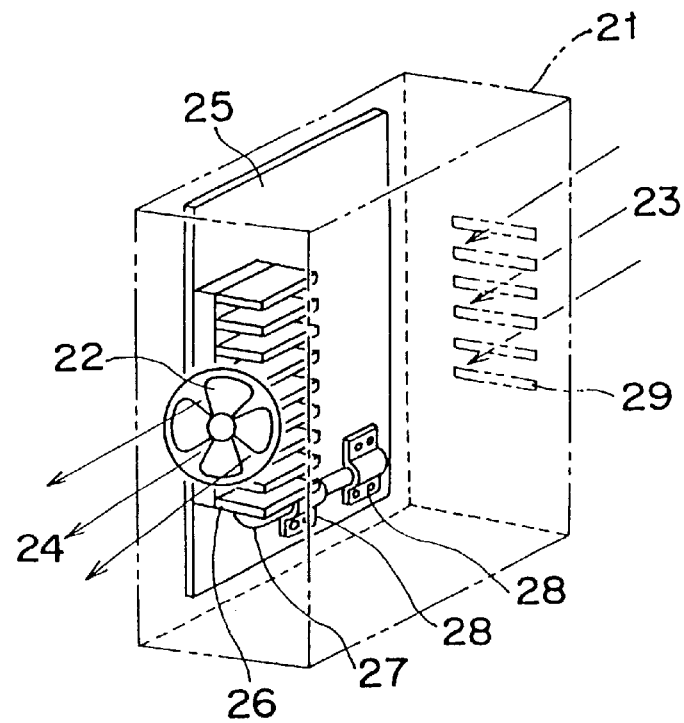
FIG. 7 is a schematic perspective view showing an apparatus for cooling a box according to the conventional art.
Figure 8:
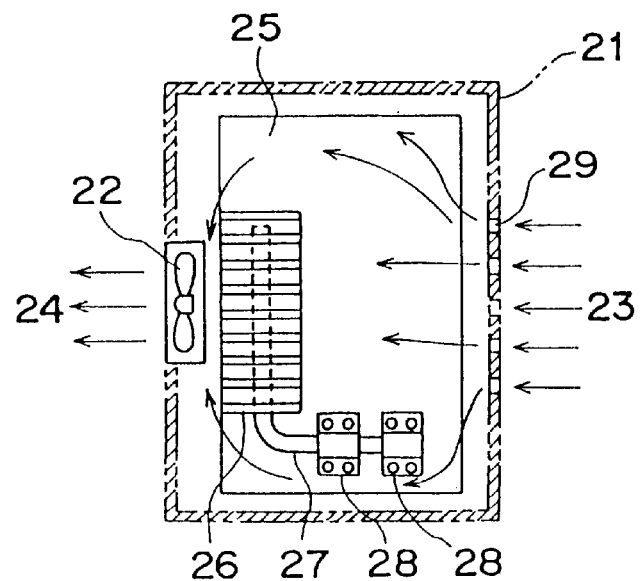
FIG. 8 is a longitudinal cross sectional view of an apparatus for cooling a box according to the conventional art.

In the apparatus for cooling a box with a heat generating element received therein, said heat dissipating fin comprises a heat sink with said heat dissipating fin fixed between a base member and a fitting member in a sandwiched manner as shown in FIGS. 5 and 6. More specifically, the heat dissipating fin 16 comprises a heat dissipating fin portion 11 which has a plurality of mountain-shaped portions 12 and base portions 13 supporting the mountain-shaped portions, a base member 14 which has a plurality of slits 15 into which the mountain-shaped portions of the heat dissipating fin portion are to be inserted and a plurality of holes 17 for fixing the heat dissipating fin portion, and a fitting member 18, provided with a plurality of projecting portions 19 corresponding to the plurality of holes of the base member, for fixing the heat dissipating fin portion between the base member and the fitting member itself.

The mountain-shaped portions 12 of the heat dissipating fin portion 11 are inserted into the slits 15 of the base member 14 to protrude above the base member and the projecting portions 19 of the fitting member 18 are inserted into the holes 17 provided in the base member 14 and the heads of the projecting portions 19 are caulked. The heat dissipating fin is fixed between the base member and the fitting member in a sandwiched manner.

The apparatus for cooling a box with a heat generating element received therein and the method for cooling same are further described by the example.

EXAMPLE

The box with the heat generating element such as semiconductor chip as shown in FIG. 1 is prepared. The size of a box with an electronic device received therein is 330 mm in length×70 mm in width×200 mm in depth. A fan for discharging air of 50 mm×50 mm in size is installed on a discharge port in the back side of the box. An air intake port is disposed on the front side of the box so as to be within a range from the front central portion to the upper side of the box with an open area ratio of 20%.

A heat generating element (25 mm in length×25 mm in width×2 mm in height, a heat generating power of 15W) mounted on a printed board of the electronic device at a position distanced 80 mm from a lower outer surface of the box and 100 mm from the front outer surface of the box was cooled according to the method for cooling a box of the present invention using the following the heat dissipating fin.

More specifically, the heat dissipating fin comprises a base member, a corrugated fin (i.e., heat dissipating fin portion), and a fitting member. A shield plate (250 mm in length×120 mm in width×0.5 mm in thickness) for electromagnetic shield made of aluminum A 1050 was used as the base member. The corrugated fin made of aluminum A1050 (height of the mountain-shaped portion: 45 mm; pitch of mountains: 3 mm; depth: 13 mm; a number of mountains: 15; thickness of the fin plate: 0.4 mm) was used as a heat dissipating fin portion. As the fitting member, a heat receiving and a heat transfer block made of an aluminum die casting (of 90 mm in length×45 mm in width×4 mm in thickness) was used, and 15 pins each of which has an outer diameter of 2 mm and a height of 1.2 mm were provided thereon for fixing.

A heat pipe having an outer diameter of 4 mm and a length of 160 mm was bent at about central portion thereof to form L shape, and placed between the fitting member and the base member so as to be positioned beneath the corrugated fin in which the heat pipe is thermally connected to the corrugated fin. A corresponding groove was formed in the fitting member (i.e., aluminum die-casting) to the shape of the heat pipe.

Eight rectangular slits of 2.6 mm×20.2 mm into which the mountain-shaped portions of the corrugated fin are inserted and 15 corresponding holes having a diameter of 2.2 mm to the pins in the fitting member were respectively formed in the base member.

The mountain-shaped portions of the corrugated fin were inserted from the lower side of the thus prepared base member, the pins were inserted into the corresponding holes, and the ends of the pins were caulked while fixing the corrugated fin in the sandwiched manner between the base member and the fitting member having the heat pipe embedded therein by pressing, thereby preparing the heat sink. The thus prepared heat sink is installed in such manner that the corrugated fin is positioned close to the air intake port.

A heat transfer rubber sheet (25 mm in length×25 mm in width×1 mm in thickness, heat transfer ratio 2.5 W/mk) was adhered onto the heat generating element.

The printed board and the heat sink were screwed on each other, the fitting member of the above-described heat sink was attached at a position where the heat transfer rubber sheet became 0.8 mm in thickness.

The apparatus was operated for four hours, and the surface temperature of the heat generating element was measured. As a result, a temperature rise from the atmospheric temperature was 20° C. and the heat resistance including the heat transfer rubber sheet was 1.3° C./W. As described above, according to the apparatus for cooling a box and the method for cooling same of the present invention, it is obvious that the improved cooling efficiency can be obtained.

In the apparatus for cooling the box with the heat generating element received therein of the present invention, since the cooling efficiency is excellent as compared with the apparatus in which the heat dissipating fin is installed close to the discharge fan, the design for heat dissipation can have a higher degree of freedom, which leads to downsizing of the heat dissipating fin and lower air flow of the discharge fan, thus improving simplification. Furthermore, the apparatus which can be vertically/horizontally installed is not restricted to the operation principle of the heat pipe, and the design can be achieved with a minimum number of the heat pipes. Therefore, according to the present invention, it is possible to provide the apparatus for cooling the box with the heat generating element received therein and the method for cooling same, thus improving the cooling efficiency of the heat dissipating fin with the heat pipes effectively functioning.

What is claimed is:

1. An apparatus for cooling a box with heat generating element received therein, comprising: an air intake port for taking in air from outside of the box; a discharge port for discharging air to outside of the box; a heat dissipating fin which is installed apart from said heat generating element and entirely disposed close to said air intake port within the box, wherein said box can be vertically and/or horizontally installed, and said heat dissipating fin is installed in such manner to be positioned in the vicinity of or above said heat generating element in the horizontal direction when said box is vertically installed, and wherein air taken into said air intake port flows in a direction that is substantially parallel to said heat dissipating fin; and heat transfer means for transferring heat generated by said heat generating element to said heat dissipating fin, wherein heat generated by said heat generating element is transferred to said heat dissipating fin by said heat transfer means, said air taken in from said air intake port is passed through said heat dissipating fin to dissipate heat generated by said heat generating element, and then air with a temperature raised by passing through said heat dissipating fin is discharged from said discharge port to outside of said box, thus cooling said box.

2. An apparatus for cooling a box with heat generating element received therein, comprising: an air intake port for taking in air from outside of the box; a discharge port for discharging air to outside of the box; a heat dissipating fin which is installed apart from said heat generating element and entirely disposed close to said air intake port within the box, wherein air taken into said air intake port flows in a direction that is substantially parallel to said heat dissipating fin, wherein said heat dissipating fin comprises a heat dissipating fin portion having a plurality of mountain-shaped portions and base portions supporting said mountain-shaped portions; a base member having a plurality of slits into which said mountain-shaped portions of said heat dissipating fin portion are to be inserted and a plurality of holes for fixing said heat dissipating fin portion; and a fitting member provided with a plurality of projecting portions corresponding to the plurality of holes of said base member for fixing said heat dissipating fin portion between said base member and said fitting member; and heat transfer means for transferring heat generated by said heat generating element to said heat dissipating fin, wherein heat generated by said heat generating element is transferred to said heat dissipating fin by said heat transfer means, said air taken in from said air intake port is passed through said heat dissipating fin to dissipate heat generated by said heat generating element, and then air with a temperature raised by passing through said heat dissipating fin is discharged from said discharge port to outside of said box, thus cooling said box.

3. A method for cooling a box with heat generating element received therein, comprising the steps of:

(1) arranging in the box an air intake port for taking in air from outside and a discharge port for discharging air from the box to the outside, and installing a heat dissipating fin and heat transfer means in the box, wherein said heat transfer means comprises at least one heat pipe, wherein said box can be vertically and/or horizontally installed, and said heat dissipating fin is installed in such manner to be positioned in the vicinity of or above said heat generating element in the horizontal direction when said box is vertically installed, and wherein air taken into said air intake port flows in a direction that is substantially parallel to said heat dissipating fin;

(2) disposing a whole of said heat dissipating fin close to said air intake port within said box and installing said heat generating element apart from said air intake port;

(3) transferring heat generated by said heat generating element to said heat dissipating fin by said heat transfer means; and (4) causing said air taken in from said air intake port to pass through said heat dissipating fin to dissipate heat generated by said heat generating element, and then discharging air with a temperature raised by passing through said heat dissipating fin from said discharge port to outside of said box, thus cooling said box.

4. A method for cooling a box with heat generating element received therein, comprising the steps of:

(1) arranging in the box an air intake port for taking in air from outside and a discharge port for discharging air from the box to the outside, and installing a heat dissipating fin and heat transfer means in the box, wherein said box can be vertically and/or horizontally installed, and said heat dissipating fin is installed in such manner to be positioned in the vicinity of or above said heat generating element in the horizontal direction when said box is vertically installed, and wherein air taken into said air intake port flows in a direction that is substantially parallel to said heat dissipating fin;

(2) disposing a whole of said heat dissipating fin close to said air intake port within said box and installing said heat generating element apart from said air intake port;

(3) transferring heat generated by said heat generating element to said heat dissipating fin by said heat transfer means; and (4) causing said air taken in from said air intake port to pass through said heat dissipating fin to dissipate heat generated by said heat generating element, and then discharging air with a temperature raised by passing through said heat dissipating fin from said discharge port to outside of said box, thus cooling said box.

5. The method as claimed in claim 4, wherein a fan for discharging air is further installed close to said discharge port.

6. An apparatus for cooling a box with heat generating element received therein, comprising: an air intake port for taking in air from outside of the box; a discharge port for discharging air to outside of the box; a heat dissipating fin which is installed apart from said heat generating element and entirely disposed close to said air intake port within the box, wherein air taken into said air intake port flows in a direction that is substantially parallel to said heat dissipating fin; and heat transfer means for transferring heat generated by said heat generating element to said heat dissipating fin, wherein heat generated by said heat generating element is transferred to said heat dissipating fin by said heat transfer means, said air taken in from said air intake port is passed through said heat dissipating fin to dissipate heat generated by said heat generating element, and then air with a temperature raised by passing through said heat dissipating fin is discharged from said discharge port to outside of said box, thus cooling said box.

7. The apparatus as claimed in claim 6, wherein said heat transfer means comprises at least one heat pipe.

8. The apparatus as claimed in claim 6, wherein a fan for discharging air is further installed close to said discharge port.

9. The apparatus of claim 6, wherein said heat dissipating fin is disposed closer to said air intake port than to said discharge port.

10. A method for cooling a box with heat generating element received therein, comprising the steps of:

(1) arranging in the box an air intake port for taking in air from outside and a discharge port for discharging air from the box to the outside, and installing a heat dissipating fin and heat transfer means in the box, wherein air taken into said air intake port flows in a direction that is substantially parallel to said heat dissipating fin;

(2) disposing a whole of said heat dissipating fin close to said air intake port within said box and installing said heat generating element apart from said air intake port;

(3) transferring heat generated by said heat generating element to said heat dissipating fin by said heat transfer means; and (4) causing said air taken in from said air intake port to pass through said heat dissipating fin to dissipate heat generated by said heat generating element, and then discharging air with a temperature raised by passing through said heat dissipating fin from said discharge port to outside of said box, thus cooling said box.

11. The method as claimed in claim 10, wherein said heat transfer means comprises at least one heat pipe.

12. The method as claimed in claim 10, wherein a fan for discharging air is further installed close to said discharge port.

13. The method as claimed in claim 11, wherein a fan for discharging air is further installed close to said discharge port.

14. The method of claim 10, wherein the step of disposing whole of said heat dissipating fin close to said air intake port within said box comprises disposing the part or the whole of said heat dissipating fin in a location that is closer to said air intake port than to said discharge port.

\* \* \* \* \*

UNITED STATES PATENT AND TRADEMARK OFFICE
CERTIFICATE OF CORRECTION

PATENT NO. : 6,637,505 B1
DATED : October 28, 2003
INVENTOR(S) : Sasaki et al.

It is certified that error appears in the above-identified patent and that said Letters Patent is hereby corrected as shown below:

<u>Title page,</u>
Item [75], Inventors, reads "Chiyoshi Sasaki, Tokyo (JP)" and should read -- Chiyoshi Sasaki, Tokyo (JP) and Yasuhiro Ootori, Tokyo (JP) --.

Signed and Sealed this

First Day of June, 2004

JON W. DUDAS
*Acting Director of the United States Patent and Trademark Office*